United States Patent [19]

Watakabe et al.

[11] Patent Number: 4,873,163
[45] Date of Patent: Oct. 10, 1989

[54] PHOTOMASK MATERIAL

[75] Inventors: Yaichiro Watakabe; Hiroaki Morimoto; Tatsuo Okamoto, all of Itami, Japan

[73] Assignee: Mitsubishi Denki Kabushiki Kaisha, Tokyo, Japan

[21] Appl. No.: 229,769

[22] Filed: Aug. 8, 1988

Related U.S. Application Data

[63] Continuation of Ser. No. 48,989, May 11, 1987, abandoned, which is a continuation of Ser. No. 777,715, Sep. 13, 1985, abandoned.

[30] Foreign Application Priority Data

Oct. 16, 1984 [JP] Japan ............................... 59-217838

[51] Int. Cl.$^4$ ............................................... G03F 1/00
[52] U.S. Cl. ...................................... 430/5; 430/323; 428/428; 428/432
[58] Field of Search ............................ 430/5, 321, 323; 428/432, 428, 446; 427/38; 378/35

[56] References Cited

U.S. PATENT DOCUMENTS

| | | | |
|---|---|---|---|
| 3,721,584 | 3/1973 | Diem | 350/318 |
| 4,113,486 | 9/1978 | Sato | 430/321 |
| 4,188,444 | 2/1980 | Landau | 428/428 |
| 4,237,150 | 12/1980 | Wiesmann | 427/74 |
| 4,284,713 | 8/1981 | Sato et al. | 430/323 |
| 4,368,230 | 1/1983 | Mizukami et al. | 428/203 |
| 4,393,127 | 7/1983 | Greschner et al. | 430/5 |
| 4,440,841 | 4/1984 | Tabuchi | 430/5 |
| 4,472,237 | 9/1984 | Deslauriers et al. | 156/643 |
| 4,661,426 | 4/1987 | Matsuda | 430/5 |
| 4,717,625 | 1/1988 | Watakabe et al. | 428/432 |
| 4,722,878 | 2/1988 | Watakabe et al. | 430/5 |
| 4,783,371 | 11/1988 | Watakabe et al. | 428/432 |
| 4,792,461 | 12/1988 | Watakabe et al. | 427/38 |

FOREIGN PATENT DOCUMENTS 157247 9/1982 Japan .

OTHER PUBLICATIONS

Watakabe et al., "High Performance Very Large Scale Integrated Photomask . . . ", J. Vac. Sci. Technol. B, vol. 41, No. 4, Jul./Aug. 1986, pp. 841-844.
Urdang et al., Random House College Dictionary, Random House Inc., N.Y., 1973.

Primary Examiner—Jose G. Dees
Attorney, Agent, or Firm—Lowe, Price, LeBlanc, Becker & Shur

[57] ABSTRACT

A photomask material according to the present invention comprises a transparent substrate and a silicide film of a transition metal formed on the transparent substrate.

11 Claims, 1 Drawing Sheet

PHOTOMASK MATERIAL

Which application is a continuation of Application Ser. No. 777,715, filed Sept. 13, 1985, abandoned. This application is a continuation of Application Ser. No. 048,989, filed May 11, 1987 now abandoned.

BACKGROUND OF THE INVENTION

1. Field of the Invention

The present invention relates to a photomask material for manufacturing a semiconductor device.

2. Description of the Prior Art

A photographic emulsion plate employing a glass substrate has been utilized as a photomask material for manufacturing a semiconductor device. However, with the demand for high integration, i.e., micropatterning, a hard mask is now widely used which comprises a metal film, such as chromium (Cr), formed on a transparent glass substrate. Japanese Patent Laying-Open Gazette No. 157247/1982 discloses a photomask prepared by forming a silicon film and a metal film on a glass substrate and depicting a pattern on the films by electron beams (EB) to form a silicide pattern.

FIG. 1 is a schematic cross-sectional view of a conventional photomask material in which a metal film 2 of chromium or the like is formed on a transparent glass substrate 1 of silica or the like. Metal film 2 is formed on the transparent glass substrate 1 by evaporation or sputtering to a thickness of about 600 to 800 Å. A photomask for manufacturing a semiconductor device is formed by coating a photoresist or an EB resist on the metal film 2 to depict a prescribed pattern on the resist film by actinic light or electron beams to be subjected to later processes such as development and etching. When the metal film 2 is made of chromium, such etching is performed by antimony cerium nitrate and perchloric acid in a wet process while the same is performed by a mixed gas of tetrachloromethane ($CCl_4$) and oxygen ($O_2$) in a dry process. The dry etching process has little side etching effect and is advantageous for manufacturing a semiconductor device such as VLSI involving high integration, i.e., micropattern.

Although the wet etching process is generally employed for manufacturing a conventional Cr photomask, it is difficult to form a highly precise mask due to the side etching effect. In the dry etching process, the etching rate of the Cr film is less than about 100 Å/min while selectivity of etching between the Cr film and the resist film is not so good, and hence the Cr photomask is not suitable for mass production. Further, the Cr film is inferior in adhesion to the quartz substrate, whereby the micropattern is apt to peel off when the mask is cleaned by ultrasonic method or scrubbing.

SUMMARY OF THE INVENTION

An object of the present invention is to overcome the aforementioned disadvantages of the conventional photomask material by providing a reliable photomask material which is easily etched by a dry process and superior in adhesion to a transparent substrate.

The photomask material according to the present invention comprises a transparent substrate and a silicide film of a transition metal on the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
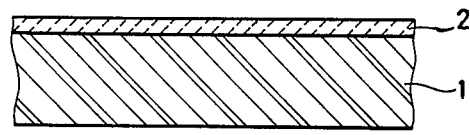
FIG. 1 is a schematic cross-sectional view showing a conventional photomask material with a metal film for manufacturing a semiconductor device.
Figure 2:
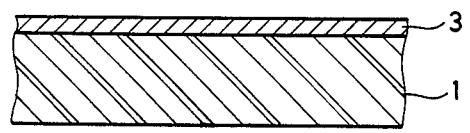
FIG. 2 is a cross-sectional view showing a photomask material employing a silicide film according to the present invention.

FIG. 2 is a schematic cross-sectional view showing a photomask material according to an embodiment of the present invention. In FIG. 2, a silicide film 3 of a transition metal such as molybdenum (Mo), tungsten (W) or tantalum (Ta) is formed in thickness of about 1000 Å on a transparent substrate 1 of silica glass or the like by sputtering, etc. When the thickness is between about 500 to 1000 Å, a film of high quality is obtained by an ionized cluster beam process.

The metal silicide is so employed as the photomask material that a photomask of high quality is provided by readiness of dry etching and goodness of adhesion to the silica substrate. A photoresist or an EB resist is coated on the silicide film 4 in thickness of about 4000 to 6000 Å, thereby to make a pattern on the glass substrate 1 by actinic light or electron beams. Since the metal silicide is conductive, no problem of charge-up is caused even if the pattern is depicted by the electron beams. Further, the metal silicide can be easily etched by a dry etching process. For example, Mo silicide is etched at a rate of about 1000 Å/min in a mixed gas of tetrafluoromethane ($CF_4$) and 2% oxygen ($O_2$) at a pressure of 0.2 Torr. under power of 300 W. This etching rate is about ten times faster than the conventional dry etching rate for chromium, and hence suitable for mass production of photomasks. Further, the metal silicide film is excellent in adhesion to the silica substrate, and hence no separation of the micropattern is caused by cleaning such as ultrasonic method or scrubbing, whereby durability of the photomask is improved.

Figure 3:
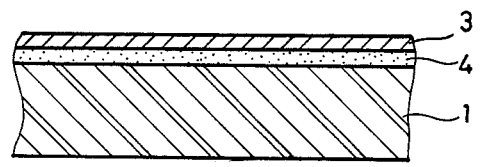
FIG. 3 is a cross-sectional view showing another embodiment of the present invention provided with a silicide film formed on a polysilicon film.

FIG. 3 shows another embodiment of the present invention. In this embodiment, a glass substrate 1 is formed thereon with a polysilicon film 4 in thickness of about 1000 Å, on which a silicide film 3 of molybdenum, tungsten or tantalum is formed in thickness of about 200 Å. In such case, the polysilicon film 4 improves adhesion between the silicide film 3 and the substrate 1, and also saves the silicide material.

Figure 4:
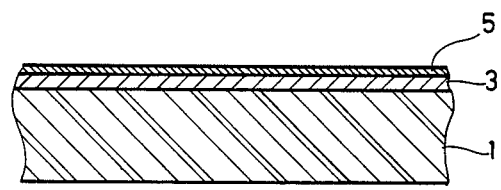
FIG. 4 is a cross-sectional view showing still another embodiment of the present invention provided with a low reflective film formed on a silicide film.

FIG. 4 shows still another embodiment of the present invention, in which a low reflective film 5 is formed on a silicide film 3. The low reflective film 5 is prepared by molybdenum oxide ($MoO_2$), tungsten oxide ($WO_2$), titanium oxide ($TiO_2$) or chromium oxide (CrO) in thickness of about 100 to 200 Å by sputtering or the like. When, for example, the low reflective film 5 of molybdenum oxide is formed on a molybdenum silicide film 3, these films can be continuously formed in the same vessel. An ion beam method or a CVD method may also be applied for forming these films.

Although the low reflective film 5 of molybdenum oxide or the like is slightly slow in etching rate, the film can be easily etched since the same is extremely thin, i.e., about 100 to 200 Å in thickness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask material blank for manufacturing a semiconductor device, said photomask material comprising:
    a mask blank in the form of a transparent substrate; and
    a silicide film of a transition metal selected from the group consisting of molybdenum, tantalum and tungsten formed on said transparent substrate and formed by one of sputtering, ionized cluster beam and CVD.

2. A photomask material in accordance with claim 1, wherein said silicide film is about 500 to 1000 Å in thickness.

3. A photomask material in accordance with claim 1, wherein said transparent substrate is made of silica glass.

4. The photomask material of claim 1, wherein said silicide film is a sputtered layer and thereby has a substantially flat film surface.

5. A photomask blank material for manufacturing a semiconductor device, said photomask material comprising:
    a transparent substrate; and
    a silicide film of a transition metal selected from the group consisting of molybdenum, tantalum and tungsten formed on said transparent substrate, wherein said silicide film is about 200 Å in thickness, and a polysilicon film of about 1000 Å in thickness is formed between said silicide film and said transparent substrate said silicide film being formed by one of sputtering, ionized cluster beam and CVD.

6. A photomask blank material for manufacturing a semiconductor device, said photomask material comprising:
    a mask blank in the form of a transparent substrate; and
    a silicide film of a transition metal selected from the group consisting of molybdenum, tantalum and tungsten formed on said transparent substrate, wherein a low reflective film is formed on said silicide film and wherein said low reflective film is prepared by an oxide of said same transition metal, said silicide film being formed by one of sputtering, ionized cluster beam and CVD.

7. A photomask material in accordance with claim 6, wherein said oxide is molybdenum oxide, tungsten oxide, titanium oxide or chromium oxide.

8. The photomask material of claim 7, wherein the thickness of said low reflective film is about 100–200 Å.

9. A method of manufacturing a photomask material comprising the steps of preparing a mask blank in the form of a transparent substrate, forming an unpatterned silicide film on said substrate by one of sputtering, ionized cluster beam and CVD, said silicide film being a transition metal selected from the group consisting of molybdenum, tantalum and tungsten and having a thickness of about 200 to 1000 Å, forming a micropattern by dry etching said silicide film and cleaning said photomask material by ultrasonic methods or scrubbing.

10. The method of claim 9, wherein said silicide film is about 200 Å in thickness, and including the further step of forming a polysilicon film of about 1000 Å in thickness between said silicide film and said transparent substrate.

11. The method of claim 9, comprising the further step of forming a low reflective film on said silicide film, said silicide film and said low reflective film being formed in the same vessel.

* * * * *